(12) United States Patent
Lin et al.

(10) Patent No.: US 12,464,879 B2
(45) Date of Patent: Nov. 4, 2025

(54) LIGHT EMITTING DIODE DEVICE

(71) Applicant: Lextar Electronics Corporation, Hsinchu (TW)

(72) Inventors: Chih-Hao Lin, Hsinchu (TW); Jian-Chin Liang, Hsinchu (TW); Shih-Lun Lai, Hsinchu (TW); Jo-Hsiang Chen, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 18/590,915

(22) Filed: Feb. 28, 2024

(65) Prior Publication Data

US 2024/0204159 A1     Jun. 20, 2024

Related U.S. Application Data

(63) Continuation of application No. 17/383,402, filed on Jul. 22, 2021, now Pat. No. 11,961,951.

(30) Foreign Application Priority Data

Jul. 29, 2020   (CN) .......................... 202021535455.0

(51) Int. Cl.
*H10H 20/857*   (2025.01)
*H01L 25/16*    (2023.01)
(Continued)

(52) U.S. Cl.
CPC ......... *H10H 20/857* (2025.01); *H01L 25/165* (2013.01); *H01L 25/167* (2013.01);
(Continued)

(58) Field of Classification Search
CPC ........................... H10H 20/857; H10H 20/814
See application file for complete search history.

(56) References Cited

U.S. PATENT DOCUMENTS 9,997,501 B2   6/2018   Bower et al.
10,483,253 B1  11/2019  Hu
(Continued)

FOREIGN PATENT DOCUMENTS

CN    103594054 A   2/2014
TW    200718347 A   5/2007
(Continued)

*Primary Examiner* — Joshua Benitez Rosario
*Assistant Examiner* — Jacob T Nelson
(74) *Attorney, Agent, or Firm* — CKC & Partners Co., LLC

(57) ABSTRACT

A light emitting diode device includes a substrate, a conductive via, first and second conductive pads, a driving chip, a flat layer, a redistribution layer, a light emitting diode, and an encapsulating layer. The substrate has a first surface and a second surface opposite thereto. The conductive via penetrates from the first surface to the second surface. The first and second conductive pads are respectively disposed on the first and second surface and in contact with the conductive via. The driving chip is disposed on the first surface. The flat layer is disposed over the first surface and covers the driving chip and the first conductive pad. The redistribution layer is disposed on the flat layer and electrically connects to the driving chip. The light emitting diode is flip-chip bonded to the redistribution layer. The encapsulating layer covers the redistribution layer and the light emitting diode.

15 Claims, 5 Drawing Sheets

(51) Int. Cl.
  *H10H 20/814* (2025.01)
  *H10H 20/82* (2025.01)
  *H10H 20/853* (2025.01)
(52) U.S. Cl.
  CPC .......... *H10H 20/814* (2025.01); *H10H 20/82* (2025.01); *H10H 20/853* (2025.01)

(56) References Cited

U.S. PATENT DOCUMENTS

| | | |
|---|---|---|
| 2017/0092626 A1 | 3/2017 | Yuan et al. |
| 2017/0188427 A1 | 6/2017 | Cok et al. |
| 2017/0213943 A1 | 7/2017 | Fukui et al. |
| 2018/0166615 A1 | 6/2018 | Takagishi |
| 2018/0197471 A1 | 7/2018 | Rotzoll et al. |
| 2018/0261149 A1 | 9/2018 | Lin |
| 2018/0277528 A1 | 9/2018 | Hasegawa et al. |
| 2018/0374831 A1 | 12/2018 | Sakariya et al. |
| 2019/0096864 A1 | 3/2019 | Huitema et al. |
| 2019/0229097 A1 | 7/2019 | Takeya et al. |
| 2019/0325803 A1* | 10/2019 | Chen ..................... H01L 25/167 |
| 2019/0371229 A1 | 12/2019 | Wang et al. |
| 2020/0058727 A1* | 2/2020 | Kim ................... H10K 59/8051 |
| 2020/0075564 A1 | 3/2020 | Lin et al. |
| 2020/0118989 A1 | 4/2020 | Wang et al. |
| 2021/0050495 A1 | 2/2021 | Yang et al. |
| 2021/0125973 A1 | 4/2021 | Kao et al. |
| 2021/0191174 A1 | 6/2021 | Li |
| 2021/0193631 A1 | 6/2021 | Bower et al. |
| 2021/0272945 A1 | 9/2021 | Lin et al. |

FOREIGN PATENT DOCUMENTS

| | | |
|---|---|---|
| TW | 200834876 A | 8/2008 |
| TW | 201515177 A | 4/2015 |
| TW | 201833890 A | 9/2018 |
| TW | 202015261 A | 4/2020 |

* cited by examiner

LIGHT EMITTING DIODE DEVICE

CROSS-REFERENCE TO RELATED APPLICATION

This application is a continuation of U.S. application Ser. No. 17/383,402, filed on Jul. 22, 2021, which claims priority to China Application Serial Number 202021535455.0, filed Jul. 29, 2020, which are herein incorporated by reference.

BACKGROUND

Field of Invention

The present disclosure relates to a light emitting diode device.

Description of Related Art

Among varieties of photoelectric devices, light emitting diodes (LEDs) are anticipated as the optimum light sources of the future for their compact size, high illuminating efficiency and longevity. In addition, due to the development of liquid crystal displays (LCD) and full color displays, white LEDs are now applied in consumer electronics products such as cell phones and personal digital assistants (PDAs) as well as the traditional applications such as indication lamps and billboard displays.

In the existing light-emitting diode devices, the driving chip and the light-emitting diode are placed on the same plane, making it difficult for the light-emitting diode to be located at the center of the light-emitting diode device, thereby affecting the symmetry of the light-emitted by the light-emitting diode device. The driving chip is generally packaged in the light-emitting diode device by wire bonding technology. However, the wire bonding technology requires planning a large space on the substrate to facilitate machine processing, which results in the limitation of the use space of the substrate.

SUMMARY

In view of the above, a purpose of the present disclosure is to provide a light emitting diode device that can solve the above problems.

To achieve the above purpose, an aspect of the present disclosure provides a light emitting diode device including a substrate, a conductive via, a first conductive pad, a second conductive pad, a driving chip, a first flat layer, second flat layer, a first redistribution layer, a second redistribution layer, a red light emitting diode, a green light emitting diode, a blue light emitting diode, and an encapsulating layer. The substrate has a first surface and a second surface opposite thereto. The conductive via penetrates from the first surface to the second surface. The first conductive pad and the second conductive pad are respectively disposed on the first surface and the second surface and in direct contact with the conductive via. The driving chip is disposed on the first surface. The first flat layer is disposed over the first surface and covers the driving chip and the first conductive pad. The second flat layer is disposed between the first flat layer and the substrate and at least covers the driving chip. The first redistribution layer is disposed on the first flat layer and electrically connects to the driving chip. The second redistribution layer is disposed between the first flat layer and the second flat layer and electrically connects to the first redistribution layer. The light emitting diode is flip-chip bonded to and in contact with the first redistribution layer. The encapsulating layer covers the first redistribution layer and the light emitting diode.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
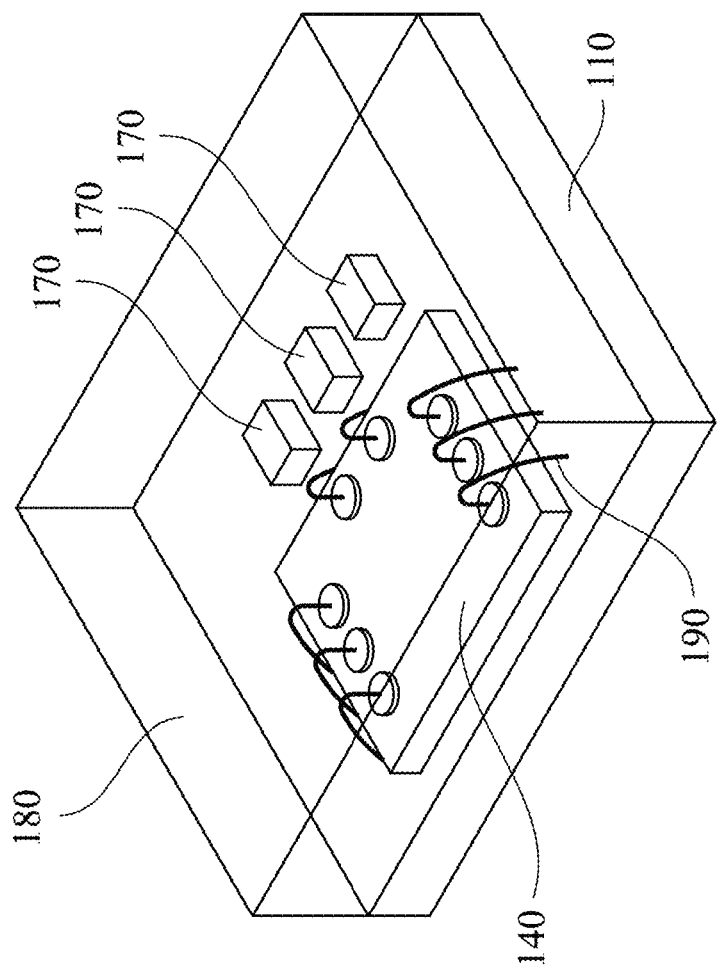
FIG. 1 is a three-dimensional schematic diagram of a light emitting diode device according to a comparative example of the present disclosure.

The description of the embodiments of the present disclosure is intended to be illustrative and not restrictive. The embodiments disclosed in the following may be combined or substituted with each other in an advantageous situation, and other embodiments may be added to an embodiment without further description or explanation.

In the following description, numerous specific details will be described in detail in order to enable the reader to fully understand the following embodiments. However, embodiments of the present disclosure may be practiced without these specific details. In other instances, well-known structures and devices are only schematically illustrated in the drawings in order to simplify the drawings.

FIG. 1 is a three-dimensional schematic diagram of a light emitting diode device 10 according to a comparative example of the present disclosure. The light emitting diode device 10 includes a substrate 110, a driving chip 140, a light emitting diode 170, an encapsulating layer 180, and a conductive wire 190. The driving chip 140 and the light emitting diode 170 both are disposed on the substrate 110. The encapsulating layer 180 is disposed on the substrate 110 and covers the driving chip 140 and the light emitting diode 170. The light emitting diode 170 is electrically connected to the substrate 110 by the way of die bonding. The driving chip 140 is electrically connected the conductive wire 190 to the substrate 110 by the way of wire bonding. It can be understood that the wire bonding requires planning a large space on the substrate 110 to facilitate machine processing, which results in the limitation of the use space of the substrate 110. In addition, the driving chip 140 and the light emitting diode 170 are disposed on the same plan of the substrate 110, making it difficult for the light emitting diode 170 to be located at the geometric center of the light emitting diode device 10, thereby affecting the symmetry of the light-emitted by the light emitting diode device 10.

Figure 2:
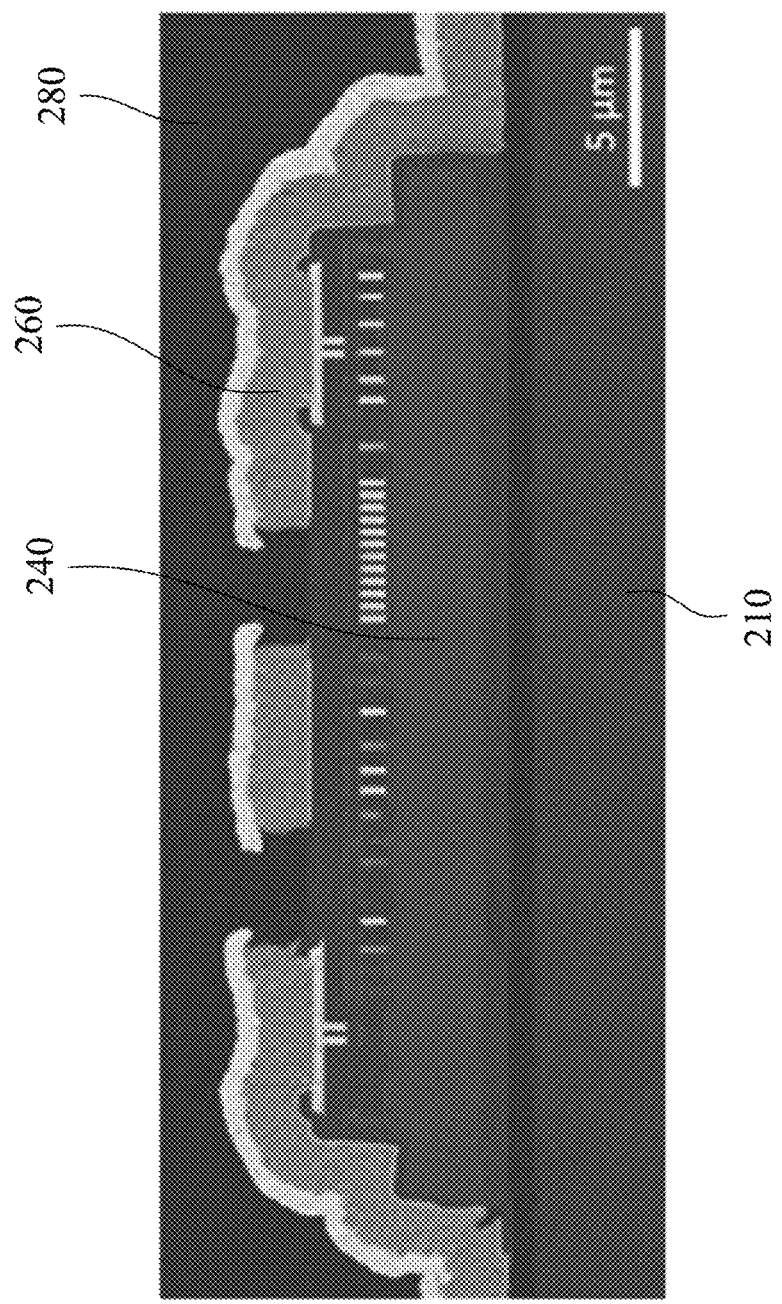
FIG. 2 is a cross-sectional image diagram of a light emitting diode device according to another comparative example of the present disclosure.

FIG. 2 is a cross-sectional image diagram of a light emitting diode device 20 according to another comparative example of the present disclosure. The light emitting diode device 20 includes a substrate 210, a driving chip 240, a redistribution layer 260, a light emitting diode (not shown), and an encapsulating layer 280. Both the driving chip 240 and the light emitting diode are disposed on the same plan of the substrate 210. The light emitting diode is electrically connected to the substrate 210 by the way of die bonding. The driving chip 240 is electrically connected to substrate 210 by the redistribution layer 260. The encapsulating layer 280 is disposed on the substrate 210 and covers the driving chip 240, the light emitting diode, and the redistribution layer 260. As electronic products become smaller and more functional, if the light emitting diode device will be miniaturized, the sizes of the light emitting diodes and the driving chips are required to be reduced. Moreover, a space-saving bonding method and a finer wire density are also required. Therefore, the circuit redistribution technology is introduced in the light emitting diode device 20. However, the use of circuit redistribution technology will still produce the following technical defects: (1) It is difficult to place the light emitting diode at the geometric center of the light emitting diode device, thereby affecting the symmetry of the light-emitted by the light-emitting diode device. (2) After the light emitting diode is disposed on the substrate, a redistribution layer formed over the light emitting diode will cover a portion of the light emitting diode: (i) if the light emitting direction of the light emitting diode is upward, the light emission efficiency of the light emitting diode will be reduced; (ii) if the light emitting direction of the light emitting diode is downward, the substrate must be made of light-transmitting material, and subsequent assembly of such products is more difficult. (3) Because the redistribution layer needs to extend from the surface of the substrate to the upper surfaces of the light emitting diode and the driving chip (more specifically, the height of the upward extension of the redistribution layer is about tens micrometers), the material selectivity, the width, precision, and thickness of the wires of the redistribution layer are limited.

Figure 3:
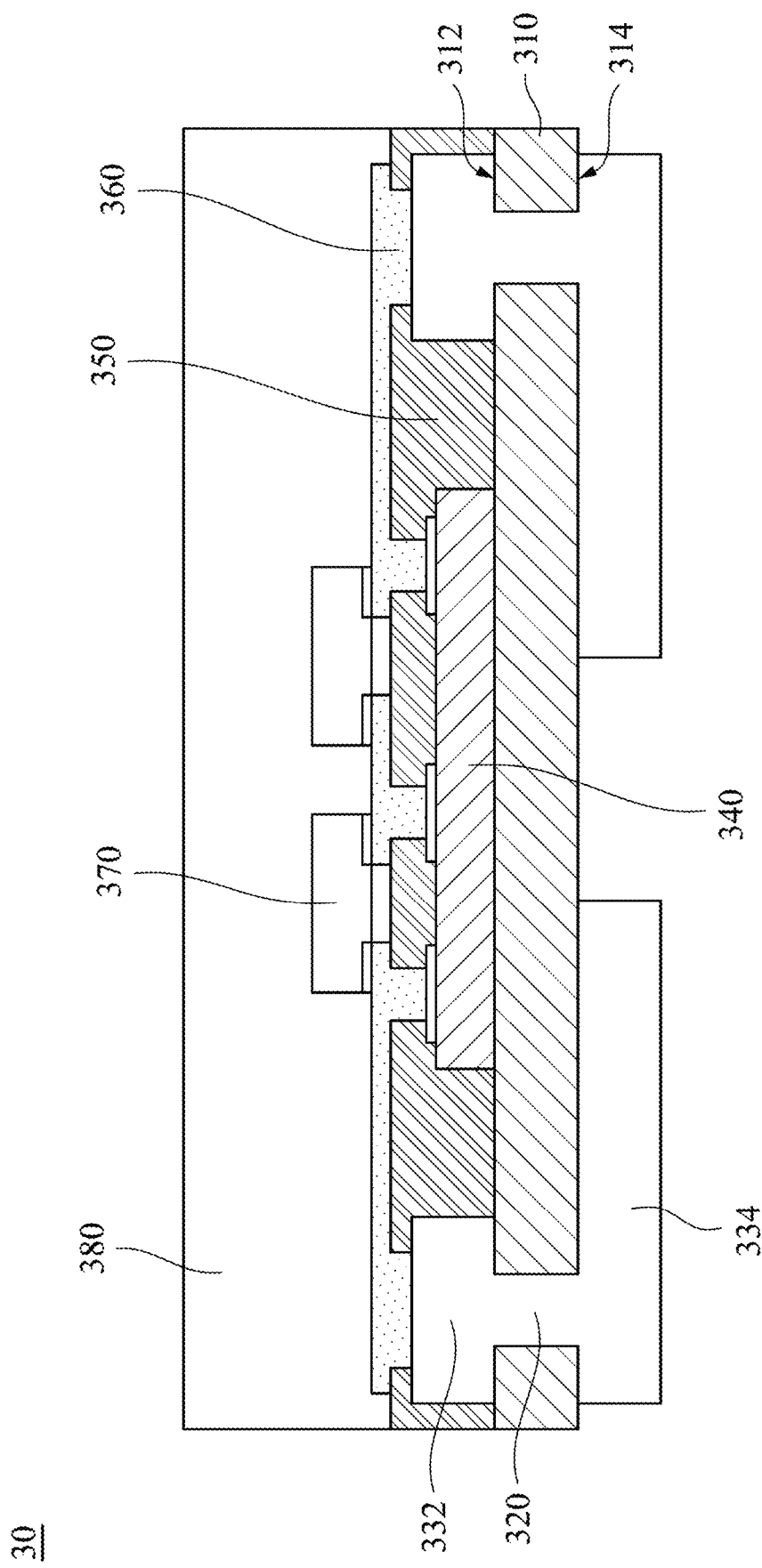
FIG. 3 is a schematic cross-sectional view of a light emitting diode device according to one embodiment of the present disclosure.

FIG. 3 is a schematic cross-sectional view of a light emitting diode device 30 according to one embodiment of the present disclosure. The light emitting diode device 30 includes a substrate 310, a conductive via 320, a first conductive pad 332, a second conductive pad 334, a driving chip 340, a first flat layer 350, a first redistribution layer 360, a light emitting diode 370, and an encapsulating layer 380. To be specific, the substrate 310 has a first surface 312 and a second surface 314 opposite thereto. In some embodiments, the substrate 310 may be a rigid printed circuit board, a high thermal conductivity aluminum substrate, a flexible printed circuit board, a flexible substrate, a glass substrate, a metal composite material board, a ceramic substrate, or a semiconductor substrate with functional components such as transistors or integrated circuits (ICs).

The conductive via 320 penetrates from the first surface 312 of the substrate 310 to the second surface 314 of the substrate 310, as shown in FIG. 3. In some embodiments, the conductive via 320 may be made of copper or other conductive materials, such as silver, nickel, tin, or aluminum, but not limited thereto. In some embodiments, a through hole may be formed and penetrates from the first surface 312 to the second surface 314 of the substrate 310 by using laser drilling, chemical drilling, mechanical drilling, or other suitable methods. Next, the conductive material may be filled into the through hole to form the conductive via 320.

The first conductive pad 332 and the second conductive pad 334 are respectively disposed on the first surface 312 and the second surface 314 of the substrate 310 and in contact with the conductive via 320, as shown in FIG. 3. In some embodiments, the material of the first conductive pad 332 and the second conductive pad 334 may be copper or other conductive materials, such as gold, silver, palladium, nickel, tin, or aluminum, but not limited thereto.

The driving chip 340 is disposed on the first surface 312 of the substrate 310, as shown in FIG. 3. The driving chip 340 in the present disclosure may be such as a micro-driving chip with a size ranging from about 1 μm to 300 μm. Moreover, the size of the micro-driving chip may be such as 10 um, 30 um, 50 um, 70 um, 100 um, 120 um, 150 um, 200 um, or 250 um. It can be understood that power supply pins of the driving chip 340 may be connected to an output terminal of a power supply circuit to receive the power supply, while driving pins of the driving chip 340 may be connected to the light emitting diode to control the operation of the circuit of the light emitting diode. In some embodiments, the driving chip 340 has an over-temperature protection (OTP) function. For example, when the internal temperature of the driving chip 340 exceeds a predetermined temperature (for example, 100° C.), a protection function, such as turning off the driver chip 121 to stop receiving the power supply, is activated.

In one embodiment, a top surface of the driving chip 340 is higher than a top surface of the first conductive pad 332. In another embodiment, the top surface of the driving chip 340 is lower than the top surface of the first conductive pad 332.

The first flat layer 350 is disposed over the first surface 312 of the substrate 310 and covers the driving chip 340 and the first conductive pad 332, as shown in FIG. 3. In some embodiments, the material of the first flat layer 350 may be oxides or photoresistive insulating materials, such as photoresist materials containing epoxy. In some embodiments, the first flat layer 350 may be formed by coating, spraying, printing, or other suitable methods. In the embodiment of the top surface of the driving chip 340 being lower than the top surface of the first conductive pad 332, a top surface of the first flat layer 350 is higher than the top surface of the first conductive pad 332.

The first redistribution layer 360 is disposed on the first flat layer 350 and connected to the driving chip 340, as shown in FIG. 3. In some embodiments, the material of the first redistribution layer 360 may include copper, nickel, gold, aluminum, silver, or other suitable metal. In another embodiment, the material of the first redistribution layer 360 may include aluminum copper, aluminum silicon copper, or other alloys. In some embodiments, the first redistribution layer 360 may be formed on the first flat layer 350 by sputtering, evaporating, electroplating, or other suitable deposition process, lithography process, and etching process. In another embodiment, a roughening process may be first performed on the first flat layer 350, so that the first redistribution layer 360 and the first flat layer 350 have a good bonding force.

In some embodiments, an upper surface of the first redistribution layer 360 is a black oxide treatment surface. In this design, the proportion of the blackened area in the light emitting diode device 30 is increased to prevent users from seeing.

The light emitting diode 370 is flip-chip bonded to and in contact with the first redistribution layer 360, as shown in FIG. 3. Although two light emitting diode 370 are illustrated in FIG. 3, the number of the light emitting diode 370 can be increased to, for example, three, four, five, six, or above, depending on design requirements. In some embodiments, the light emitting diode 370 may be a red light emitting diode, a green light emitting diode, a blue light emitting diode, a yellow light emitting diode, white light emitting diode, and a combination thereof. In some embodiments, the light emitting diode 370 may a mini-LED or a micro-LED.

In some embodiments, a vertical projection of the light emitting diode 370 overlaps with a vertical projection of the driving chip 340.

The encapsulating layer 380 covers the first redistribution layer 360 and the light emitting diode 370, as shown in FIG. 3. In some embodiments, the encapsulating layer 380 may include an organic packaging material, an inorganic packaging material or combinations thereof. For example, the organic packaging material comprises silicon rubber, acrylic and epoxy resin, while the inorganic packaging material comprises silicon dioxide and fluorine adhesive. However, the present disclosure is not limited thereto. In some embodiments, the encapsulating layer 380 may be formed by dispensing, molding, glue-filling or other suitable processes. The encapsulating layer 380 can increase the area capable to block moisture and protect the light emitting diode 370 and the driving chip 340 from moisture, thereby increasing the reliability and service life of the product. In some embodiments, a distance from the top surface of the light emitting diode 370 to the top surface of the encapsulating layer 380 is smaller than a distance from an outer sidewall of the light emitting diode 370 to a sidewall of the encapsulating layer 380.

In some examples, an additive (not shown) may further be added to the encapsulating layer 380 to conceal wires and increase the brightness of light-emitting elements. For example, the additive may be organic particles or inorganic particles, such as ceramic particles, metal particles, glass particles and polymer particles, and the like.

Figure 4:
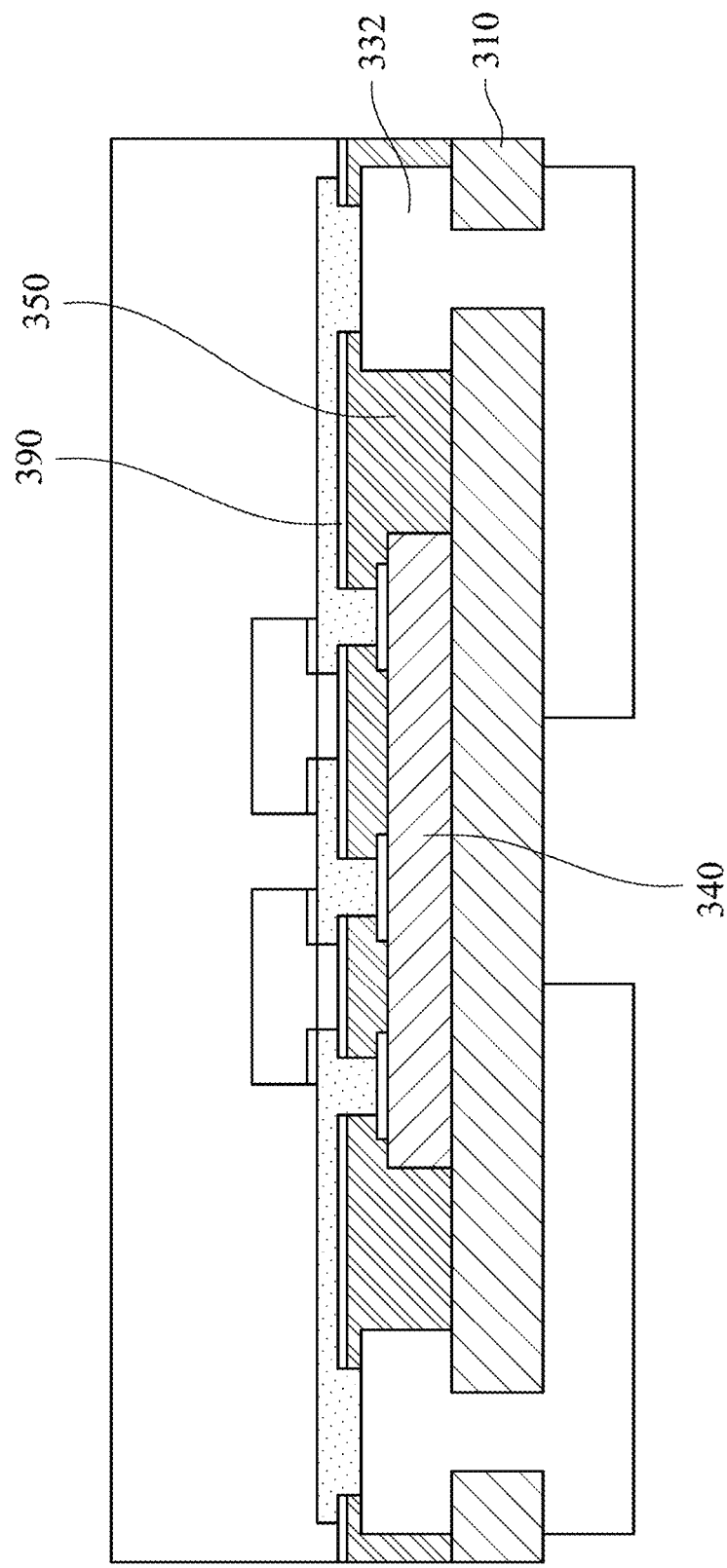
FIG. 4 is a schematic cross-sectional view of a light emitting diode device according to another embodiment of the present disclosure.

FIG. 4 is a schematic cross-sectional view of a light emitting diode device 40 according to another embodiment of the present disclosure. In order to facilitate the comparison with the aforementioned embodiments and simplify the description, the same reference numbers are used in the following embodiments to refer to the same or like parts. Also, the differences between embodiments are discussed below and similar parts will not be repeated.

The light emitting diode device 40 is different from the light emitting diode device 30 as the light emitting diode device 40 further includes a reflective layer 390 disposed on the top surface of the first flat layer 350. In some embodiments, the reflective layer 390 may be a silver reflector, an aluminum reflector or a distributed Bragg reflector (DBR). Specifically, the distributed Bragg reflector may be composed of two or more thin films stacked alternatively, in which the thin films are homogenous or heterogeneous materials with different refractive indices. For example, the distributed Bragg reflector may be composed of alternatively stacked $SiO_2$ and $TiO_2$ thin films or alternatively stacked $SiO_2/Al_2O_3/TiO_2$ thin films. This design can increase the light emission efficiency of the light emitting diode device 40.

Figure 5:
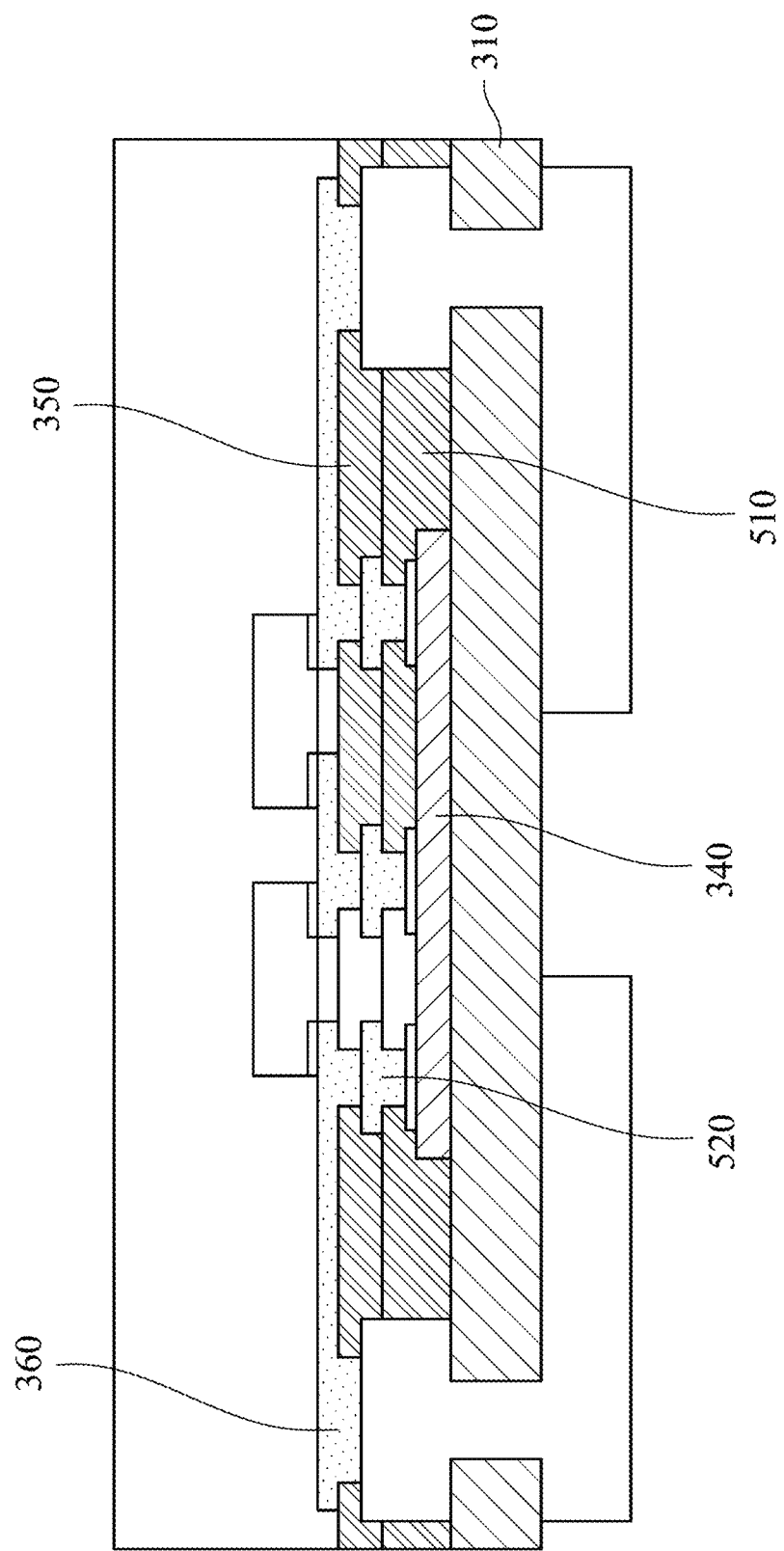
FIG. 5 is a schematic cross-sectional view of a light emitting diode device according to yet another embodiment of the present disclosure.

FIG. 5 is a schematic cross-sectional view of a light emitting diode device 50 according to yet another embodiment of the present disclosure. In order to facilitate the comparison with the aforementioned embodiments and simplify the description, the same reference numbers are used in the following embodiments to refer to the same or like parts. Also, the differences between embodiments are discussed below and similar parts will not be repeated.

The light emitting diode device 50 is different from the light emitting diode device 30 as the light emitting diode device 50 further includes a second flat layer 510 and a second redistribution layer 520. More specifically, the second flat layer 510 is disposed between the first flat layer 350 and the substrate 310, and the second flat layer 510 at least covers the driving chip 340. The second redistribution layer 520 is disposed between the first flat layer 350 and the second flat layer 510 and electrically connected to the first redistribution layer 360. In some embodiments, the material and the manufacturing method of the second flat layer 510 may be the same or similar to those of the first flat layer 350. In some embodiments, the material and the manufacturing method of the second redistribution layer 520 may be the same or similar to those of the first redistribution layer 360.

In summary, in the light emitting diode device of the present disclosure, the flat layer is used to alleviate the level difference in the conventional redistribution layer, such that the redistribution layers can be flatly disposed on the flat layer and is therefore capable to maintain narrow, thin circuits with high precision. The design of the light emitting diode device of the present disclosure can make the light emitting diode and the driving chip be located on the different level. The placement positions of the light emitting diode and the driving chip do not influence each other, so that the light emitting diode can be disposed at the center, thereby not affecting the symmetry of the light emitted by the light-emitting diode device and achieving a better optical effect. Since the light emitting diode is flip-chip bonded to and disposed on the redistribution layer, the light emitting diode may not be covered by any circuit, and its light extraction efficiency will not be affected. Furthermore, the light emitting diode device of the present disclosure does not need to use a substrate with high-precision circuits. In addition, the design of the present disclosure can easily miniaturize the light emitting diode device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light emitting diode device, comprising:
a substrate having a first surface and a second surface opposite thereto;
a conductive via penetrating from the first surface to the second surface;
a first conductive pad and a second conductive pad respectively disposed on the first surface and the second surface and in contact with the conductive via;
a driving chip disposed on the first surface;
a first flat layer disposed over the first surface and covering the driving chip and the first conductive pad;
a second flat layer disposed between the first flat layer and the substrate and at least covering the driving chip;
a first redistribution layer disposed on the first flat layer and electrically connected to the driving chip;
a second redistribution layer disposed between the first flat layer and the second flat layer and electrically connected to the first redistribution layer;
a red light emitting diode, a green light emitting diode, and a blue light emitting diode flip-chip bonded to and in contact with the first redistribution layer; and an encapsulating layer covering the first redistribution layer and the red light emitting diode, the green light emitting diode, and the blue light emitting diode.

2. The light emitting diode device of claim 1, wherein a vertical projection of the red light emitting diode, the green light emitting diode, and the blue light emitting diode overlaps with a vertical projection of the driving chip.

3. The light emitting diode device of claim 1, further comprising a reflective layer disposed on a top surface of the first flat layer.

4. The light emitting diode device of claim 3, wherein the reflective layer comprises a silver reflector, an aluminum reflector, or a distributed Bragg reflector.

5. The light emitting diode device of claim 1, wherein a top surface of the driving chip is higher than a top surface of the first conductive pad.

6. The light emitting diode device of claim 1, wherein a top surface of the driving chip is lower than a top surface of the first conductive pad.

7. The light emitting diode device of claim 6, wherein a top surface of the first flat layer is higher than the top surface of the first conductive pad.

8. The light emitting diode device of claim 1, wherein the second flat layer comprises an oxide or a photoresistive insulating material.

9. The light emitting diode device of claim 1, wherein an upper surface of the first redistribution layer is a black oxide treatment surface.

10. The light emitting diode device of claim 1, wherein the driving chip is a micro-driving chip.

11. The light emitting diode device of claim 1, wherein the first flat layer comprises an oxide or a photoresistive insulating material.

12. The light emitting diode device of claim 1, wherein a top surface of the first flat layer has a surface roughness.

13. The light emitting diode device of claim 1, further comprising an additive disposed in the encapsulating layer.

14. The light emitting diode device of claim 1, wherein the red light emitting diode, the green light emitting diode, and the blue light emitting diode are micro-LED.

15. The light emitting diode device of claim 1, wherein the first redistribution layer includes copper, nickel, gold, aluminum, or silver.

* * * * *